(12) United States Patent
Fukuda

(10) Patent No.: US 6,946,790 B2
(45) Date of Patent: Sep. 20, 2005

(54) ORGANIC ELECTROLUMINESCENCE DEVICE

(75) Inventor: Yoshinori Fukuda, Saitama (JP)

(73) Assignee: Pioneer Corporation, Tokyo (JP)

( * ) Notice: Subject to any disclaimer, the term of this patent is extended or adjusted under 35 U.S.C. 154(b) by 148 days.

(21) Appl. No.: 10/679,502

(22) Filed: Oct. 7, 2003

(65) Prior Publication Data

US 2004/0119405 A1 Jun. 24, 2004

(30) Foreign Application Priority Data

Oct. 8, 2002 (JP) .................................... P2002-295481

(51) Int. Cl.[7] ................................................ H01J 1/62
(52) U.S. Cl. ...................................... 313/506; 313/503
(58) Field of Search ............................... 313/498, 503, 313/504, 506, 512

(56) References Cited

U.S. PATENT DOCUMENTS 5,847,506 A * 12/1998 Nakayama et al. ......... 313/504

FOREIGN PATENT DOCUMENTS

JP 2001-332391 11/2001

* cited by examiner

*Primary Examiner*—Vip Patel
(74) *Attorney, Agent, or Firm*—Morgan Lewis & Bockius LLP

(57) ABSTRACT

An organic electroluminescence (EL) device has a low-reflectance laminated structure using optical interference composed of a first semitransparent layer, a second semitransparent layer and a reflective layer laminated in this order or an order opposite thereto. The organic EL device has a structure in which an organic electroluminescence layer including a light-emissive organic material sandwiched by at least two electrodes. The second semitransparent layer constituting the low-reflectance laminated structure is made of an organic material.

11 Claims, 8 Drawing Sheets

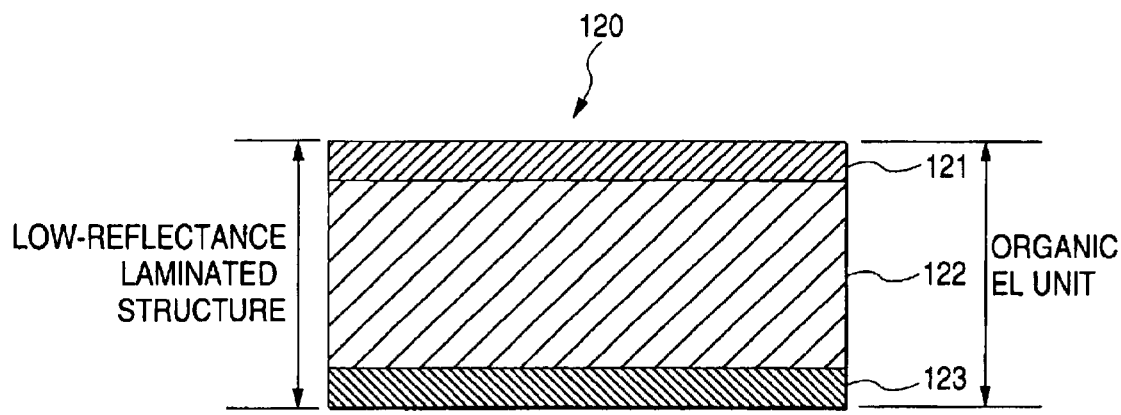
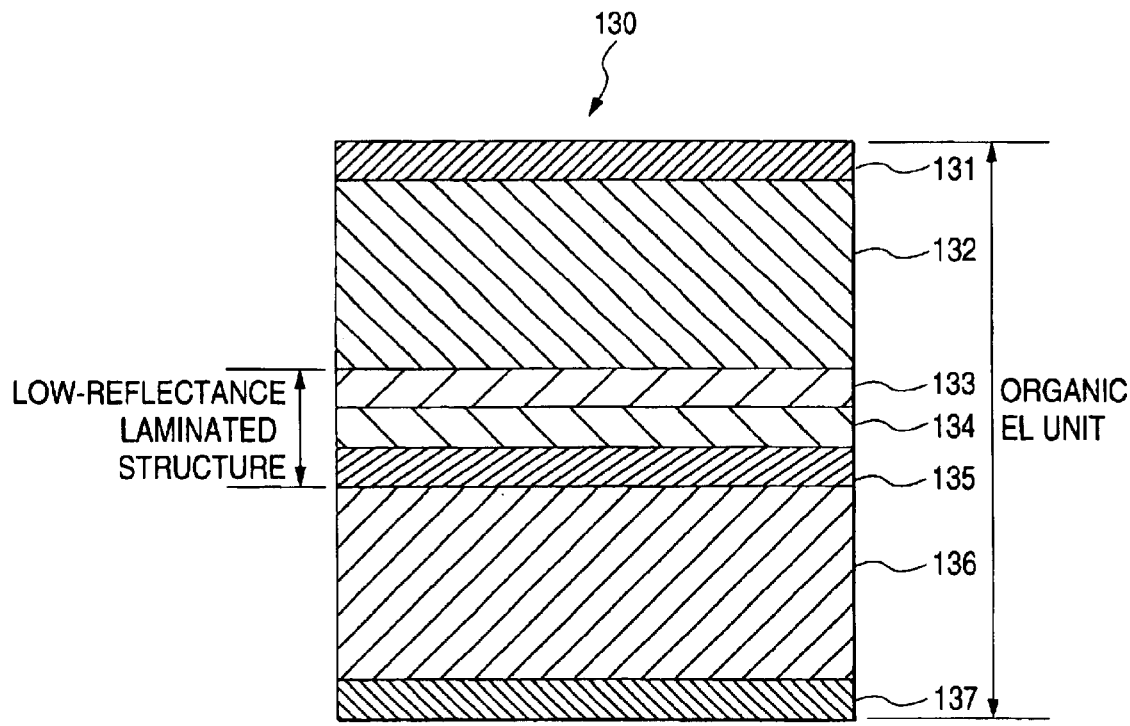

ORGANIC ELECTROLUMINESCENCE DEVICE

The present disclosure relates to the subject matter contained in Japanese Patent Application No. 2002-295481 filed on Oct. 8, 2002, which is incorporated herein by reference in its entirety.

BACKGROUND OF THE INVENTION

1. Field of the Invention

The present invention relates to an organic electroluminescence (EL) device, and more particularly to an organic EL device that provides less external light reflection.

2. Description of the Related Art

The organic EL device includes a transparent electrode deposited and patterned on a transparent substrate, which serves as an anode; a functional organic material layer composed of a hole transporting material layer, a light-emissive material layer and an electron transporting material layer successively laminated on the transparent electrode; and a cathode laminated on the functional organic material layer. The cathode may be made of a metal material such as a Mg—Ag alloy or a Al—Li alloy. As a display, the organic EL device employs the EL light extracted externally from the device through the transparent substrate.

The cathode provided on a backside opposite to the direction of externally extracting the light has high reflectivity and gives a strong optical interference effect to the device. Therefore, by optimizing the reflection interference phenomenon of the internal EL light by the backside metallic cathode, the intensity of the EL light externally extracted can be increased.

The backside metallic cathode, however, can increase the EL light intensity, but reflects most of external light incident to the inside of the device. Therefore, the backside metallic cathode greatly deteriorates the visibility of the EL light. In order to avoid such inconvenience, the organic EL device must be provided so as to suppress the reflection of the external light by the backside metallic cathode.

One method conventionally known for suppressing the reflection of the external light is to use a circularly-polarizing filter. However, using the circularly-polarizing filter, which is highly costed, leads to an increase in the production cost. Further, since the circularly-polarizing filter has transparency of about 40% as itself, using the circularly-polarizing filter also attenuates the intensity of the internal EL light externally extracted to about 40%.

Another known method for suppressing the reflection of external light is to employ the optical interference effect so that the reflection of external light is decreased by a low-reflectance laminated structure of an optical thin layer. The low-reflectance laminated structure is disclosed in JP-2001-332391 (particularly on page 5 and in FIG. 3)

JP-2001-332391 discloses the low-reflectance laminated structure composed of aluminum, zinc oxide (ZnO) and aluminum. In particular, in JP-2001-332391, on indium tin oxide (ITO) which is a transparent electrode deposited on a transparent substrate, successively deposited are 4,4'-bis-[(1-naphthyl)-N-phenylamino]-biphenyl (NPD), which serves as a hole transporting layer, and tris(8-quinolinolato-N1, 08)-aluminum ($Alq_3$), which serves as a light emitting layer. Thereafter, lithium fluoride is deposited. On the lithium fluoride layer thus formed, aluminum, zinc oxide (ZnO) and aluminum are successively deposited to provide the low-reflectance structure.

The zinc oxide (ZnO) layer employed in the low-reflectance laminated structure disclosed in JP-2001-332391 is a conductive inorganic layer. Therefore, it is required an evaporation source in producing the above configured organic EL device. Further, the organic layer of the organic EL device is liable to suffer from the damage during the deposition and becomes thermally damaged when the inorganic material such as ZnO is thermally evaporated at a high temperature.

The organic layer also becomes damaged by reflected electrons when a material which requires electron beam deposition (EB deposition) is need to be used. Meanwhile, since the low-reflectance laminated structure serves as a cathode of the organic EL device, the above secondsemi-transparent layer must be conductive. For this reason, in the example disclosed in JP-2001-332391, the material which gives less damage to the organic material could not be selected for the low-reflectance laminated structure.

SUMMARY OF THE INVENTION

It is therefore an object of the invention to provide an organic electroluminescence device provided with a low-reflectance structure without being damaged in production process.

In order to achieve the object, according to one aspect of the invention, there is provided an organic electroluminescence device including: a low-reflectance laminated structure having low reflectance for a predetermined wavelength band of light with use of optical interference and having a first semitransparent layer, a second semitransparent layer and a reflective layer laminated in this order; an organic thin layered unit including a organic material having luminescent characteristic; and a pair of electrodes configured to support the organic thin layered unit from both sides, wherein the second semitransparent layer comprises the organic material.

BRIEF DESCRIPTION OF THE DRAWINGS

The above objects and advantages of the present invention will become more apparent by describing in detail preferred exemplary embodiments thereof with reference to the accompanying drawings, wherein:

FIG. 9 is a sectional view showing a layered structure of an organic EL device according to a second modification;

FIG. 10 is a sectional view showing a layered structure of an organic EL device according to a third modification.

DETAILED DESCRIPTION OF THE PREFERRED EMBODIMENTS

The inventor of the present invention has found that the low-reflectance laminated structure can be formed of aluminum, which used in an ordinary organic electroluminescence (EL) device, and an organic material. The inventor of also found that the low-reflectance laminated structure including the organic material as a semiconductor can be employed as a cathode.

Referring now to the accompanying drawings, there are shown preferred embodiments of the invention.

(First Embodiment)

Figure 1:
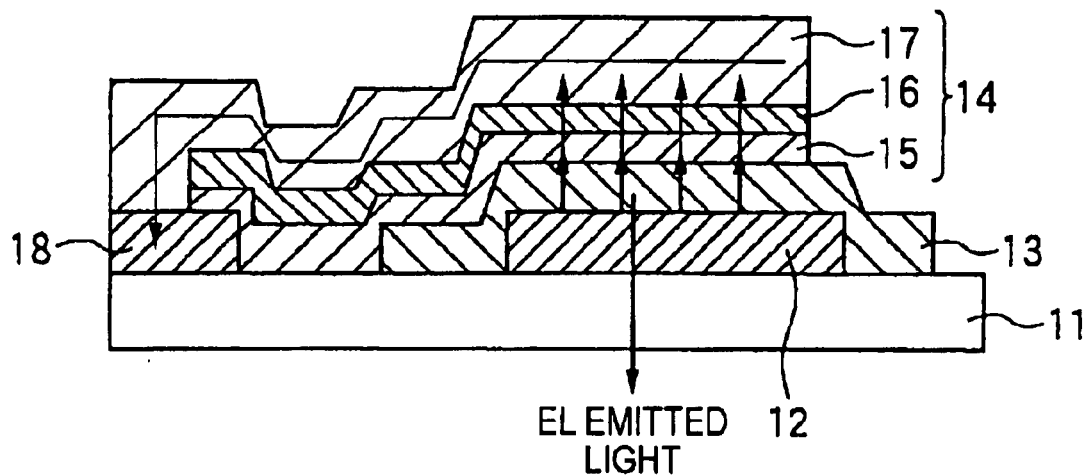
FIG. 1 is a sectional view of an organic electroluminescence (EL) device according to a first embodiment of the invention.

An explanation will be given of a first embodiment of the organic EL device according to the invention. FIG. 1 is a view showing an organic EL device 10 according to the first embodiment. The organic EL device 10 includes a transparent electrode 12 made of ITO serving as an anode, an organic layer 13 and a backside electrode structure 14 serving as a cathode. These elements are successively laminated in this order on a transparent substrate 11.

The organic layer 13 is formed in such a manner that after the transparent electrode 12 deposited on the transparent electrode 11 has been subjected to necessary steps such as patterning, a plurality of organic materials are successively deposited thereon by heating in a vacuum chamber. For example, on the transparent electrode 12, a hole transporting layer having a thickness of several tens to several hundreds nanometers has been deposited, a light emitting layer is likewise deposited and further an electron transporting layer is deposited. As for the function of these layers, a single layer may have a plurality of functions, or otherwise the laminate of plural materials may have a single function. The above manner of deposition is to deposit a low-molecular organic EL material. However, solutions of macromolecular organic EL materials may be successively applied by spin coating or ink jetting.

The organic EL device composed of a plurality of layers successively laminated behaves as a PN junction type semiconductor light emitting diode. Specifically, when a voltage is applied between the transparent electrode 12 and backside electrode structure 14, holes are injected into the organic layer 13 from the transparent electrode 12 serving as the anode, and electrons are injected into the organic layer 13 from the backside electrode structure 14 serving as the cathode. The holes are transported through the hole transporting layer and the electrons are transported through the electron transporting layer. Both carriers are re-combined with each other within the light emitting layer so that the energy thus created excites the molecules within the light emitting layer. Thus, when the excited molecules return to the ground state, fluorescence or phosphorescence is emitted.

The backside electrode structure 14 is a layer deposited on the organic layer 13 and serves as a low-reflectance laminated structure composed of a plurality of layers. The backside electrode structure 14 includes a first semitransparent layer 15 made of metal, a second semitransparent layer 16 of an organic material evaporated on the first semitransparent layer 15, and a reflective layer 17 made of metal laminated on the second semitransparent layer 16.

The light incident from the transparent substrate 11 is partially transmitted through and partially reflected from the first semitransparent layer 15. The first semitransparent layer 15 is thin enough not to form an absolute layer and provides low continuity at a stepped portion. The first semitransparent layer 15, therefore, has a wiring resistance in a transverse direction (direction in parallel to the transparent substrate 11) so that a current does not almost flow therethrough.

The first semitransparent layer 15 is a light semitransparent layer vacuum-deposited on the organic layer 13 by heating. The first semitransparent layer 15 may be made of metal such as Al, Au, Cr, Cu or Ag, or otherwise metal such as Mg or Ca having a low work function. The first semitransparent layer 15 is preferably conductive and does not damage the organic layer 13 during the deposition by vacuum heating deposition.

The second semitransparent layer 16 is a light semitransparent layer made of an organic material and deposited on the first semitransparent layer 15. The second semitransparent layer 16 is deposited by laminating an organic material on the first semitransparent layer 15 by vacuum heating deposition. The second semitransparent layer 16 is made of semiconductor or conductor so that a current can flow between the first semitransparent layer 15 and the reflective layer 17. For example, the second semitransparent layer 16 may be made of material such as tris(8-quinolinolato-N1, 08)-aluminum ($Alq_3$), or copper phthalocyanine. The $Alq_3$ and copper phthalocyanine have the same composition as that of the layer within the organic layer 13. For this reason, the second semitransparent layer 16 can be deposited without increasing the number of deposition sources during the deposition for manufacturing the device. The temperature when an organic material is deposited as the second semitransparent layer 16 is approximately in a rage of from 200° C. to 350° C. The temperature is much lower than the temperature (1725° C.) when the inorganic semitransparent layer made of material such as ZnO is deposited. Therefore, the depositing of the second semitransparent layer provides less damage to the organic layer 13 and small thermal load to the vacuum chamber of a manufacturing apparatus.

The reflective layer 17 is an optical reflective layer that may be made of the same material as or different material from the first semitransparent layer 15. The reflective layer 17 has a sufficiently small resistance as a wiring to serve as a charge path which permits a current to flow along the path indicated by arrows in FIG. 1. The reflective layer 17 transports the electrons supplied from an extending electrode 18 and injects the electrons into the organic layer 13 through the second semitransparent layer 16 and the first semitransparent layer 15. The reflective layer 17 may not necessarily be made of the same material as the first semitransparent layer 15, but is preferably made of the same material as the first semitransparent layer 15 to prevent the number of deposition sources from being increased.

The first semitransparent layer 15, the second semitransparent layer 16 and the reflective layer 17, which constitute the backside electrode structure 14, serve as a low-reflectance laminated structure for the light which is incident from the outside of the transparent substrate 11. The light which is incident on the low-reflectance laminated structure is reflected at the interfaces between the organic layer 13 and the first semitransparent layer 15, between the first semitransparent layer 15 and the second semitransparent layer 16 and between the second semitransparent layer 16 and the reflective layer 17. The reflected beams of light at the respective interface interfere with one another. In the low-reflectance laminated structure, the respective thicknesses of the first semitransparent layer 15 and the second semitransparent layer 16 are adjusted so that the light having an objective wavelength is weakened owing to optical interference and light absorption. For example, the optical layer thickness of the second semitransparent 16 is adjusted so that it is approximately ¼ as long as the objective wavelength λ.

In accordance with the configuration described above, the external light incident on the organic EL device 10 from the outside is first incident on the backside electrode structure 14 which is the low-reflectance laminated structure and the light with the intensity reduced is emitted externally from the low-reflectance laminated structure, thus providing a device with little reflection of the external light. Accordingly, the backside electrode structure 14 can serve as the backside electrode of the organic EL device and the low-reflectance laminated structure.

In a case where the second semitransparent layer 16 is formed of the same material as that of the organic layer 13, the same deposition source can be shared so that the number of deposition sources can be decreased. Also in the case, the organic layer 13 can be prevented from being contaminated by depositing the second semitransparent layer 16.

In the first embodiment, where the first semitransparent layer 15 is made of Al and the second semitransparent layer 16 is made of $Alq_3$, the deposition temperature may be lower than in the case of depositing the inorganic material such as ZnO. Therefore, in depositing the second semitransparent layer 16, the organic layer 13 is prevented from being damaged. Further, where Al and $Alq_3$ are employed, since these materials can be deposited at a lower temperature, the load to the deposition source can be reduced.

Incidentally, in the first embodiment, the second semitransparent layer 16 is made as a conductor or a semiconductor. However, as long as the first semitransparent layer 15 has a thickness enough to supply charges to the organic layer 13 and has continuity in the transverse direction, the second semitransparent layer 16 may be made of insulator.

(Second Embodiment)

Figure 2:
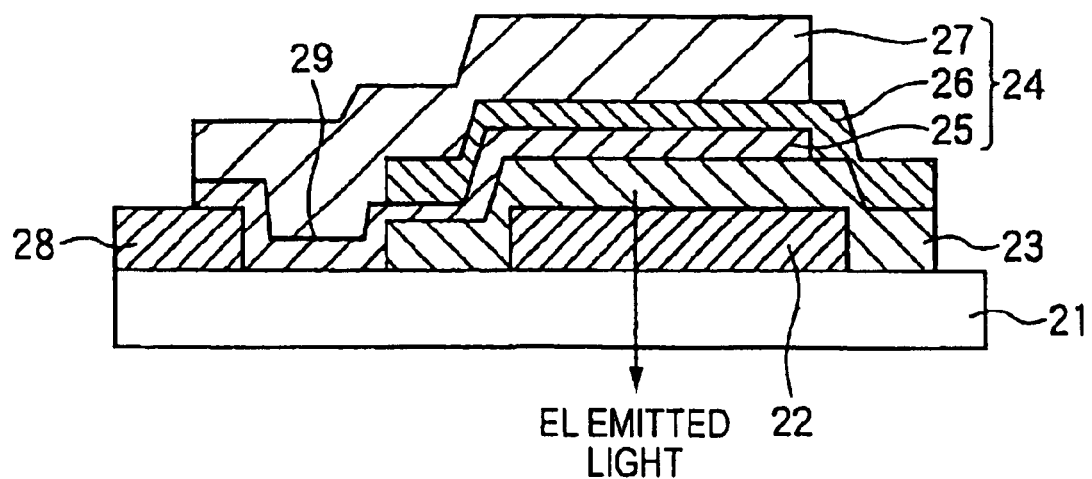
FIG. 2 is a sectional view of the organic EL device according to a second embodiment of the invention.

An explanation will be given of a second embodiment of the present invention. FIG. 2 is a view showing an organic EL device 20 according to the second embodiment. The organic EL device 20 includes a transparent electrode 22 made of ITO serving as an anode, an organic layer 23 and a backside electrode structure 24 serving as a cathode. These elements are successively laminated in this order on a transparent substrate 21. The transparent substrate 21, transparent electrode 22 and organic layer 23 are identical to the transparent substrate 11, transparent electrode 12 and organic layer 13 in the first embodiment.

The backside electrode structure 24 is a layer deposited on the organic layer 23 and serves as a low-reflectance laminated structure composed of a plurality of layers. The backside electrode structure 24 includes a first semitransparent layer 25 which is conductive, a second semitransparent layer 26 of an organic material evaporated on the first semitransparent layer 25, and a reflective layer 27 which is conductive, laminated on the second semitransparent layer 26. It should be noted that the first semitransparent layer 25, the second semitransparent layer 26 and the reflective layer 27 may be made of the same materials as the first semitransparent layer 15, second semitransparent layer 16 and reflective layer 17 in the first embodiment.

In the second embodiment, above an extending electrode 28 for supplying electrons, the second semitransparent layer 26 is not deposited, but the first semitransparent layer 25 and the reflective layer 27 are connected to each other at a connecting portion 29 above the extending electrode 28. In the configuration according the second embodiment, unlike the first embodiment, a current flows, not through the second semitransparent layer 26 but from the extending electrode 28 in the order of the reflective layer 27, connecting portion 29 and first semitransparent layer 25. The second semitransparent layer 26 may also be insulator.

The first semitransparent layer 25, the second semitransparent layer 26 and the reflective layer 27, which constitute the backside electrode structure 24, serve as a low-reflectance laminated structure for the light which is incident from the outside of the transparent substrate 21. The light which is incident on the low-reflectance laminated structure is reflected at the interfaces between the organic layer 23 and the first semitransparent layer 25, between the first semitransparent layer 25 and the second semitransparent layer 26 and between the second semitransparent layer 26 and the reflective layer 27. The reflected beams of light at the respective interface interfere with one another. In the low-reflectance laminated structure, the respective thicknesses of the first semitransparent layer 25 and the second semitransparent layer 26 are adjusted so that the light having an objective wavelength is weakened owing to optical interference and light absorption. For example, the optical layer thickness of the second semitransparent layer 26 is adjusted so that it is approximately ¼ to the objective wavelength λ.

In accordance with the configuration described above, the external light incident on the organic EL device 20 from the outside is first incident on the backside electrode structure 24 which is a low-reflectance laminated structure and the light with the intensity reduced is emitted externally from the low-reflectance laminated structure. Thus, the output intensity of the external light is reduced and the intensity of the EL light emitted from the organic layer 23 is relatively increased. Accordingly, the backside electrode structure 24 can serve as the backside electrode of the organic EL device and the low-reflectance laminated structure.

In the second embodiment, where the second semitransparent layer 26 is made of Al and $Alq_3$, the deposition temperature may be lower than in the case of deposition of the inorganic material such as ZnO. Therefore, the organic layer 23 is less being damaged in deposition of the second semitransparent layer 26. Further, where Al and $Alq_3$ are employed, since these materials can be deposited at a lower temperature, the load to the deposition source can be reduced.

Where the second semitransparent layer 26 is formed of the same material as that of the organic layer 23, the same deposition source can be shared so that the number of deposition sources can be decreased.

(The Layered Structure)

Figure 7:
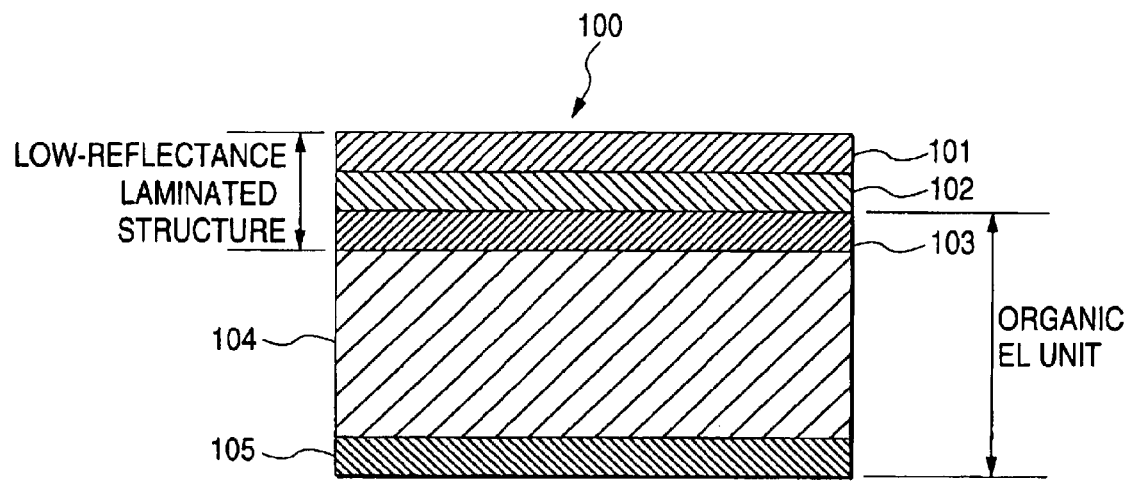
FIG. 7 is a sectional view showing a layered structure of the organic EL device.

FIG. 7 schematically shows the layered structure of the organic EL devices 10 and 20 of the first and the second embodiments.

The organic EL device 100 in FIG. 7 is configured of an organic thin layered unit 104 including a organic material having luminescent characteristic arranged on an electrode layer 105, and provided on the organic layered unit 104, a first semitransparent film 103, a second semitransparent film 102 and a reflection layer 101 stacked in this order.

The reflection layer 101, the second semitransparent film 102 and the first semitransparent film 103 constitute a low reflectance stacked layered structure that attenuates the light having the wavelength in concern by means of optical interference as well as light absorption.

The second semitransparent film 102 is made of an organic material. This second semitransparent film 102 may be composed of the organic material that constitutes organic thin layered unit 104.

In the organic EL device 100, the first semitransparent film 103 acts as an electrode that supplies electron or hole to the organic thin layered unit 104. And an organic EL unit is configured by the first semitransparent film 103, the organic thin layered unit 104 and the electrode layer 105. In other words, in the organic EL device 100, the organic EL unit and the low-reflectance laminated structure partially overlap.

In the organic EL device 100, the first semitransparent film 103 may accept electron or hole through the second semitransparent film 102 or the second semitransparent film 102 together with the reflection layer 101, or directly from an external supply source or supplying circuit.

In the organic EL device 100, electron or hole is supplied to the organic thin layered unit 104 from the electrode layer 105 and the first semitransparent film 103, respectively, whereby the electron and hole recombine within the organic thin layered unit 104 to emit light. The emitted light emerges outwards from the side of the electrode layer 105.

An exterior light incident on the electrode layer 105 from outside is reflected at the interface between the organic thin layered unit 104 and the first semitransparent film 103, the one between the first semitransparent film 103 and the second semitransparent film 102, and the one between the second semitransparent film 102 and the reflection layer 101 whereby the reflected light at each interface interferes with each other and is attenuated. Accordingly, the reflectance of the exterior light is lowered, thus relatively enhancing the brightness of the light emitted from the organic thin layered unit 104.

Alternatively, a design may be adopted in which the light emitted from the organic thin layered unit 104 emerges from the side of the reflection layer 101, whereby the first semitransparent film 103 substantially acts as a reflection layer and the reflection layer 101 substantially acts as a first semitransparent film, thus enabling the reduction of the reflectance of the exterior light incident from the reflection layer 101.

The layered structure of the organic EL device associated with the invention should not be construed as restricted to that of the above-described organic EL device 100, but a variety of modifications can be assumed.

Figure 8:
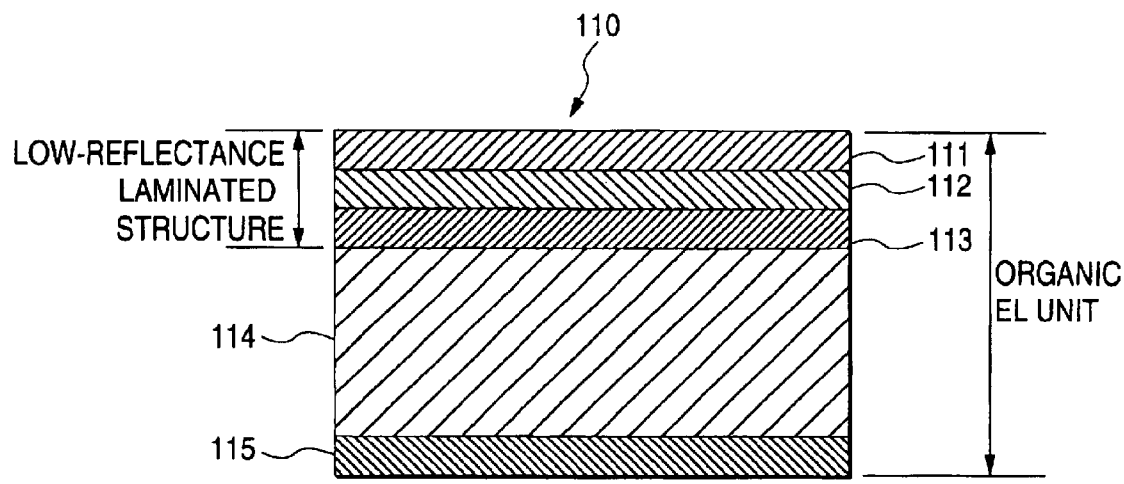
FIG. 8 is a sectional view showing a layered structure of an organic EL device according to a first modification.

FIG. 8 is a diagram showing a first modification of the layered structure for the organic EL device.

The organic EL device 110 depicted in FIG. 8 is configured of an organic material layer 114 arranged on an electrode layer 115, and, provided on the organic material layer 114, a first semitransparent film 113, a second semitransparent film 112 and a reflection layer 111 stacked in this order.

The reflection layer 111, the second semitransparent film 112 and the first semitransparent film 113 constitute a low reflectance stacked layer unit that attenuates the light having the wavelength in concern by means of optical interference as well as light absorption.

Further, in the present modified example, an organic material having luminescent characteristic is provided in one of the organic material layer 114, the first semitransparent film 113 or the second semitransparent film 112, and an organic thin layered unit is comprised of the organic material layer 114, the first semitransparent film 113 or the second semitransparent film 112.

The reflection layer 111 acts as an electrode that supplies electron or hole to the second semitransparent film 112, and an organic EL unit to emit an organic EL light is comprised of the reflection layer 111, the second semitransparent film 112, the first semitransparent film 113, the organic material layer 114, the first and second semitransparent films 113 and 112 and the electrode layer 115. In other words, the organic EL device 110 is of a structure in which the organic EL unit involves a low reflectance stacked layered structure.

At least the second semitransparent film 112 is made of an organic material.

In the organic EL device 100, electron and hole are supplied to the organic thin layered unit from the electrode layer 115 and the first semitransparent film 113, respectively, whereby the electron and hole recombine within the organic thin layered unit to emit light. The emitted light emerges outwards from the side of the electrode layer 115.

Further, an exterior light incident on the electrode layer 115 from outside is reflected at the interface between the organic material layer 114 and the first semitransparent film 113, the one between the first semitransparent film 113 and the second semitransparent film 112, and the one between the second semitransparent film 112 and the reflection layer 111 whereby the reflected light at each interface interferes with each other and is attenuated. Accordingly, the reflectance of the exterior light is lowered, thus relatively enhancing the brightness of the light emitted from the organic thin layered unit 114.

Alternatively, a design may be adopted in which the light emitted from the organic thin layered unit emerges from the side of the reflection layer 111, whereby the first semitransparent film 113 substantially acts as a reflection layer and the reflection layer 111 substantially acts as a first semitransparent film, thus enabling the reduction of the reflectance of the exterior light incident from the reflection layer 111.

FIG. 9 is a diagram showing a second modified example of the layered structure for the organic EL device.

The organic EL device 120 depicted in FIG. 9 is configured of an organic material layer 122 including a organic material having luminescent characteristic arranged on a first electrode layer 123, and a second electrode layer 121 arranged on the organic thin layered unit 122.

In the present configuration, the second electrode layer 121, the organic thin layered unit 122 and the first electrode layer 123 each constitute a reflection layer, a second semitransparent film and a first semitransparent film respectively, whereby these layers as a whole constitute a low reflectance stacked layered structure that attenuate the light of the wavelength in concern by means of optical interference as well as light absorption. Further, an organic EL unit that emits an organic EL light is configured by the second electrode layer 121, the organic thin layered unit 122 and the first electrode layer 123. In other words, the organic EL device 120 has a structure that the entire organic EL unit constitutes a low reflectance stacked layered structure.

In the organic EL device 120, electron and hole are supplied to the organic thin layered unit 122 from the second electrode layer 121 and the first electrode layer 123, respectively, whereby light emission takes place by the recombination of the electron and hole within the organic thin layered unit 122. The emitted light emerges outwards from the side of the electrode layer 123.

Further, an exterior light incident on the electrode layer 123 from outside is reflected at the interface between the first electrode layer 123 and the outside, the one between the first electrode layer 123 and the organic thin layered unit 122, and the one between the organic thin layered unit 122 and the second electrode layer 121 whereby the reflected light at each interface interferes with each other and is attenuated. Accordingly, the reflectance of the exterior light is lowered, thus relatively enhancing the brightness of the light emitted from the organic thin layered unit 122.

Alternatively, a design may be adopted in which the light emitted from the organic thin layered unit 122 emerges from the side of the second electrode layer 121, whereby the first electrode layer 123 substantially acts as a reflection layer and the second electrode layer 121 substantially acts as a first semitransparent film, thus enabling the reduction of the reflectance of the exterior light incident from the second electrode layer 121.

FIG. 10 is a diagram showing a third modified example of the layered structure for the organic EL device.

The organic EL device 130 depicted in FIG. 10 is configured of a plurality of organic material layers 136, 135, 134, 133 and 132 stacked in this order on a first electrode layer 137, and a second electrode layer 131 provided on the organic material layer 132.

At least one of the plural organic material layers 132, 133, 134, 135 and 136 is a luminescent layer including a luminescent organic material, and the plural organic material layers 132, 133, 134, 135 and 136 as a whole constitute an organic thin layered unit.

In the present modified example, the organic material layer 135 in the organic thin layered unit constitutes a first semitransparent film, the organic material layer 134 in the same unit constitutes a second semitransparent film, and the organic material layer 133 in the same unit constitutes a reflection layer, whereby these layers as a whole constitute a low reflectance stacked layered structure that attenuate the light of the wavelength in concern by means of optical interference as well as light absorption. Further, the first electrode layer 131, the plural organic material layers 132, 133, 134, 135 and 136, and the second electrode layer 137 constitute as a whole an organic EL unit that emits an organic EL light. In other words, in the organic EL device 130, a low reflectance stacked layered structure is formed within the organic EL unit.

In the organic EL device 130, electron and hole are supplied to the organic thin layered unit from the first and second electrode layers 137 and 131 respectively, whereby light emission takes place by the recombination of the electron and hole within the organic thin layered unit. The emitted light emerges outwards from the side of the first electrode layer 137.

Further, an exterior light incident on the first electrode layer 137 from outside is reflected at the interface between the two organic material layers 136 and 135, the one between the two organic material layers 135 and 134, and the one between the two organic material layers 134 and 133 whereby the reflected light at each interface interferes with each other and is attenuated. Accordingly, the reflectance of the exterior light is lowered, thus relatively enhancing the brightness of the light emitted from the organic thin layered unit.

Alternatively, a design may be adopted in which the light emitted from the organic thin layered unit emerges from the side of the second electrode layer 131, whereby the organic material layer 133 substantially acts as a first semitransparent film, and the organic material layer 135 substantially acts as a reflection layer, thus enabling the reduction of the reflectance of the exterior light incident from the side of the second electrode layer 131.

Figure 11:
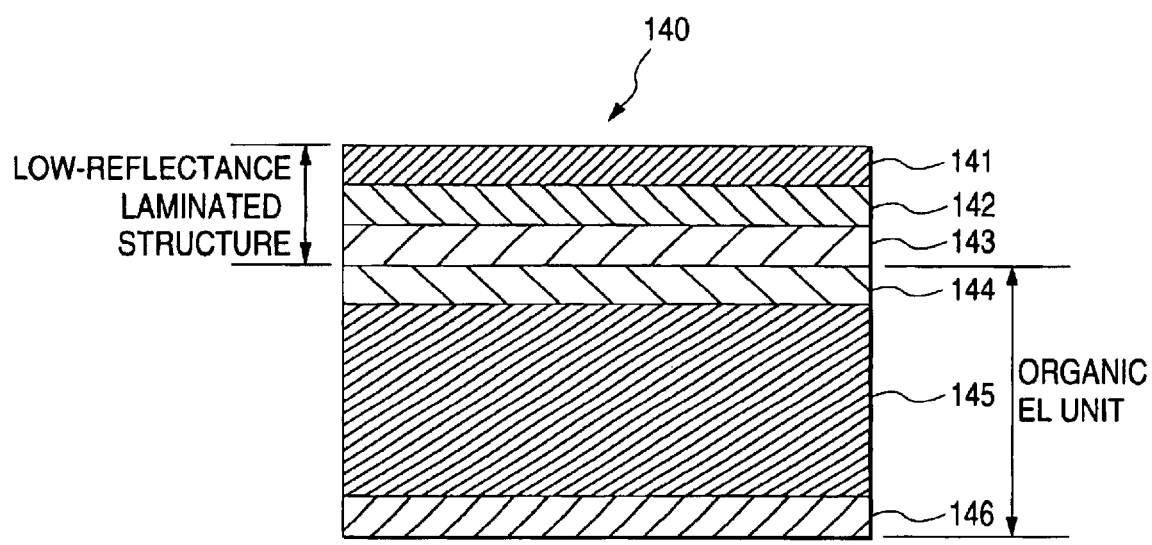
FIG. 11 is a sectional view showing a layered structure of an organic EL device according to a fourth modification.

FIG. 11 is a diagram showing a fourth modified example of the layered structure for the organic EL device.

The organic EL device 140 depicted in FIG. 11 is configured of an organic thin layered unit 145 including a organic material having luminescent characteristic arranged on a first electrode layer 146, a second electrode layer 144 stacked on the organic thin layered unit 145, and a first semitransparent film 143, a second semitransparent film 142 and a reflection layer 141 stacked in this order on this second electrode layer 144.

The reflection layer 141, the second semitransparent film 142 and first semitransparent film 143 constitute a low reflectance stacked layered structure that attenuates the light having the wavelength in concern by means of optical interference as well as light absorption.

The second semitransparent film 142 is made of an organic material. This second semitransparent film 142 may be composed of the organic material that constitutes the organic thin layered unit 145.

In the organic EL device 140, an organic EL unit for emitting an organic EL light is configured of the first electrode layer 146, the organic thin layered unit 145 and the second electrode layer 144. In other words, in the organic EL device 140, a low-reflectance laminated structure is provided on the organic EL unit.

In the organic EL device 140, electron and hole are supplied to the organic thin layered unit 145 from the first and second electrode layers 146 and 147, respectively, whereby the electron and hole recombine within the organic thin layered unit 145 to emit light. The emitted light emerges outwards from the side of the first electrode layer 146.

Further, an exterior light incident on the first electrode layer 146 from outside is reflected at the interface between the second electrode layer 144 and the first semitransparent film 143, the one between the first semitransparent film 143 and the second semitransparent film 142, and the one between the second semitransparent film 142 and the reflection layer 141 whereby the reflected light at each interface interferes with each other and is attenuated. Accordingly, the reflectance of the exterior light is lowered, thus relatively enhancing the brightness of the light emitted from the organic thin layered unit 145.

Alternatively, a design may be adopted in which the light emitted from the organic thin layered unit 145 emerges from the side of the reflection layer 141, whereby the first semitransparent film 143 substantially acts as a reflection layer and the reflection layer 141 substantially acts as a first semitransparent film, thus enabling the reduction of the reflectance of the exterior light incident from the reflection layer 141.

In the descriptions heretofore, each organic EL device has a single low reflectance stacked layered structure. However, the number of the low reflectance stacked layered structure is not limited to one, but a plurality of low reflectance stacked layered structures may be provided in an organic EL device.

Hereinafter, an explanation will be given of specific examples according to above described embodiments.

EXAMPLE 1

As a first example (Example 1) according to the invention, a low-reflectance laminate structure including the second semitransparent layer 16, 26 of tris(8-quinolinolato-N1, 08)-aluminum ($Alq_3$) in the first and the second embodiments, are made. In order to make the low-reflectance laminated structure, in a simple case, the optical layer thickness of $Alq_3$ may be approximately ¼ to the objective wavelength $\lambda$ of the light to be reduced. The refractive index of $Alq_3$, which can be measured by using a method such as ellipsometry method, is 1.76 at the wavelength of 525 nm.

Assuming that the refractive index of the layer is n and the thickness thereof is d, the optical thickness thereof is given by "n·d". In a case of the $Alq_3$ layer, the thickness d which gives ¼ of $\lambda(=525$ nm$)$ can be expressed by the following formula.

$n \cdot d = 525/4 = 131.25$ $d = 74.6$ nm

Figure 3:
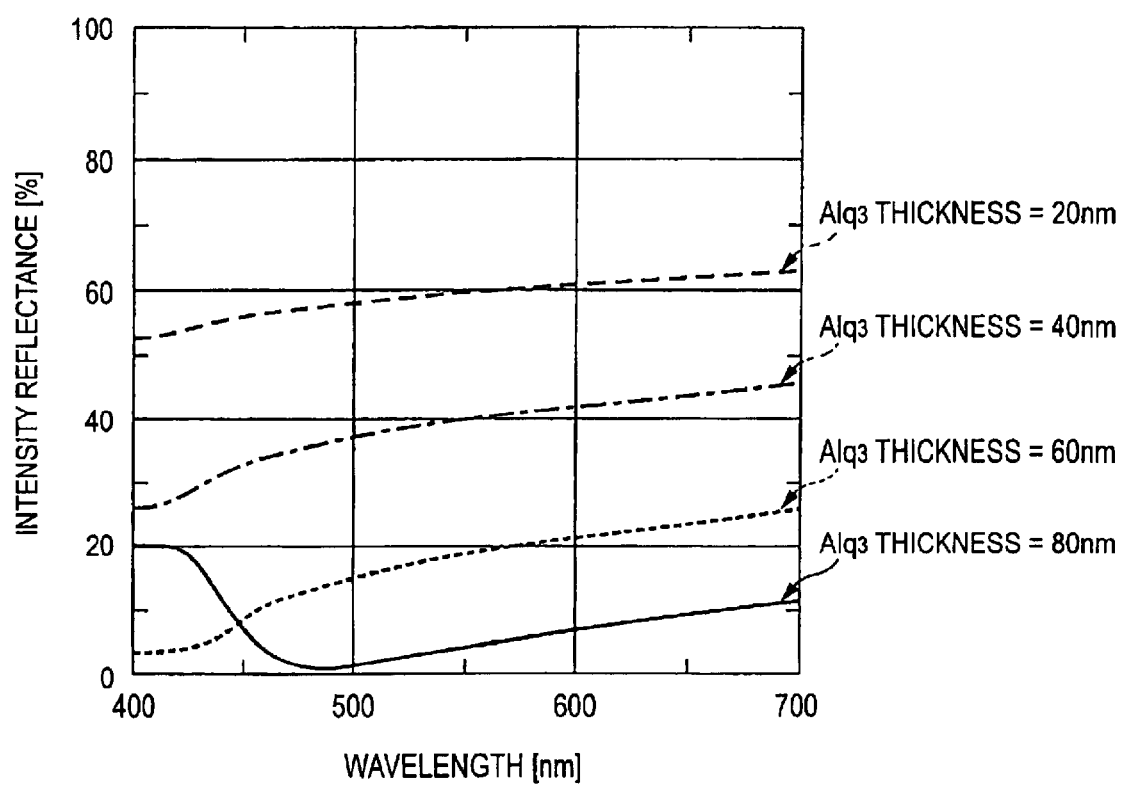
FIG. 3 is a graph showing the reflectivity of the low-reflectance laminated structure according to a first example when seen from the side of soda lime glass.

On soda lime glass, which had been ultrasonic-cleaned using detergent and thereafter dried, an aluminum layer having a thickness of 5 nm was deposited by vacuum heating deposition. Likewise, by vacuum heating deposition, an $Alq_3$ layer was deposited with thicknesses of 20 nm, 40 nm, 60 nm and 80 nm, respectively for each example according to the first example, was deposited. Subsequently, likewise, by vacuum heating deposition, an aluminum layer having a thickness of 100 nm was deposited, thus providing the laminated structures. FIG. 3 is a graph showing the intensity reflectivity when the laminated structure is seen from the side of the soda lime glass in Example 1. As seen from the graph, it was confirmed that the minimum value of the reflectivity is approximately 1% and the reflectivity can be adjusted by adjusting the thickness of the $Alq_3$ layer.

EXAMPLE 2

As a second example (Example 2) according to the invention, the low-reflectance laminated structure of the first example was used as the cathode of the organic EL device 20 according to the second embodiment. The transparent electrode deposited on soda lime glass was patterned. On the transparent electrode, the organic EL device was made by the following process.

On the soda lime glass having a size of 30×30 mm, stripes each having a width of 2 mm were patterned. On the stripes, an organic material having a size of 6×12 mm was deposited. On the organic layer thus formed, a hole injecting layer of copper phthalocyanine 25 nm thick, a hole transporting layer of NPD 45 nm thick and a light emitting layer of $Alq_3$ 60 nm thick were successively deposited by heating in vacuum chamber. Thereafter, an electron injection additive of $Li_2O$ 0.3 nm thick was deposited. An aluminum layer of 5 nm thick having a width of 2 mm was deposited in the direction perpendicular to the transparent electrode. A layer of $Alq_3$ 80 nm thick having a size of 6×12 mm was deposited. Finally, an aluminum layer 2 mm wide and 100 nm thick in the direction perpendicular to the transparent electrode was deposited again, whereby the EL organic device according to the second example (Example 2) is produced. In the second example, in the vicinity of pixels, by connecting the thick aluminum layer which is highly conductive and reflective and the thin aluminum layer which is the first semitransparent layer serving as the electrode of the organic EL device, the first semitransparent layer was effectively employed as the cathode of the organic EL device.

COMPARATIVE EXAMPLE 1

As a first comparative example (Comparative example 1), on a transparent electrode deposited on soda lime glass and patterned, a hole injecting layer of copper phthalocyanine 25 nm thick, a hole transporting layer of NPD 45 nm thick and a light emitting layer of $Alq_3$ 60 nm thick were successively deposited by heating in vacuum chamber. Thereafter, an electron injection additive of $Li_2O$ 0.3 nm thick was deposited. Finally, an aluminum layer 100 nm thick was deposited, whereby an organic EL device according to the first comparative example is produced.

Figure 4:
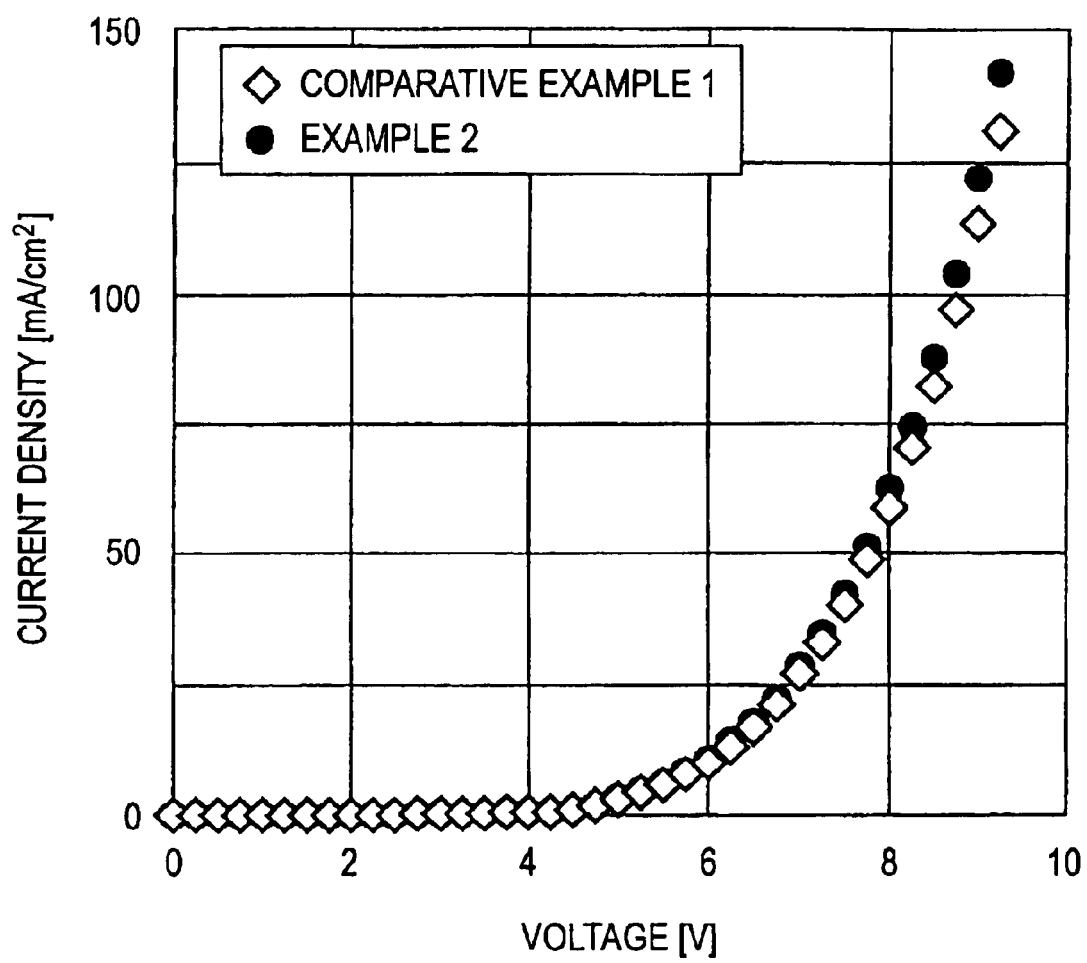
FIG. 4 is a graph for comparing the voltage-current characteristics of the device according to a second example and a first comparative example.

FIG. 4 is a graph showing the voltage-current characteristic of the devices according to the second example and the first comparative example. From the graph of FIG. 4, it can be seen that the voltage-current characteristic is almost the same in both the second example and the first comparative example. This permits to conclude that the organic diode equally functions in both devices, and the internal light-emitting intensities of the devices for the same current are also equal. Further, it has been also confirmed that the light emitting plane visually recognized is uniform and the low-reflectance laminated structure including $Alq_3$ effectively serves as a cathode.

EXAMPLE 3

As a third example (Example 3) according to the invention, the low-reflectance laminate structure was made which includes the second semitransparent layer 16, 26 of copper phthalocyanine (CuPC) in the first and second embodiments. On soda lime glass, which had been ultrasonic-cleaned using detergent and thereafter dried, an aluminum layer having a thickness of 5 nm was deposited by vacuum heating deposition. Likewise, by vacuum heating deposition, a CuPC layer having thicknesses of 50 nm, 70 nm, 90 nm, 120 nm and 150 nm, respectively for each example according to the third example, was deposited. Subsequently, likewise, by vacuum heating deposition, an aluminum layer having a thickness of 100 nm was made, whereby the laminated structure was made.

Figure 5:
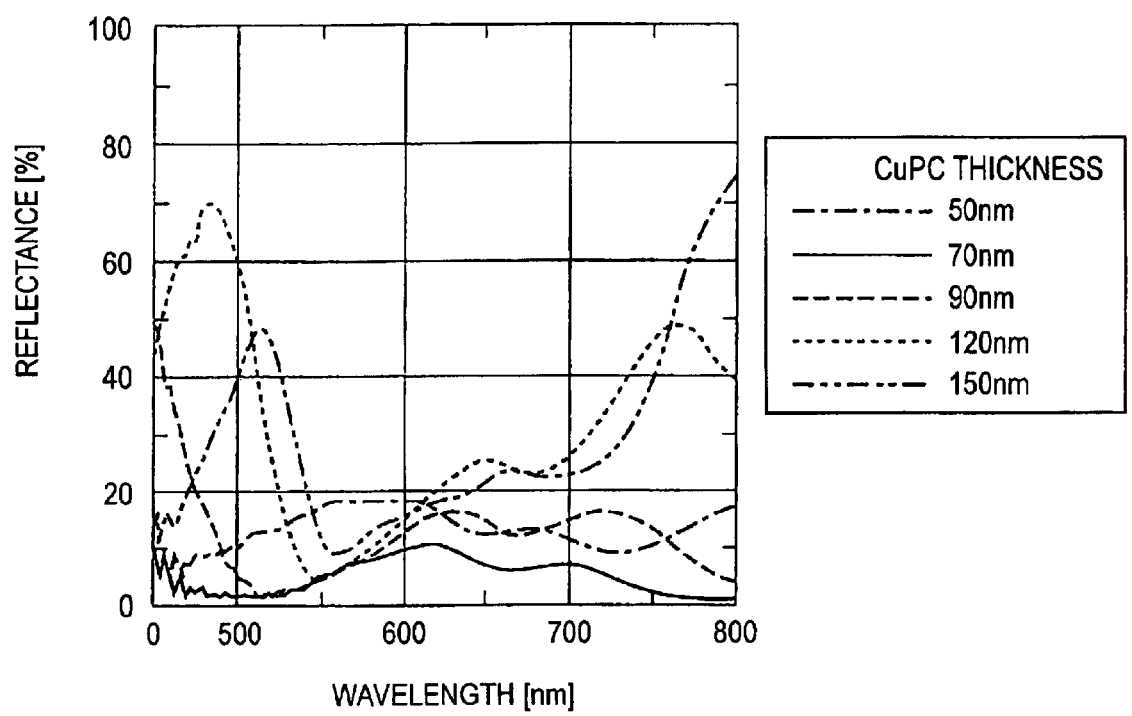
FIG. 5 is a graph showing the reflectivity of the low-reflectance laminated structure according to a second example when seen from the side of soda lime glass.

FIG. 5 is a graph showing the intensity reflectivity of the low-reflectance laminated structure with the second semitransparent layer of CuPC according to the third example, where the laminated structure is seen from the side of the soda lime glass. As seen from the graph, it was confirmed that the minimum value of the reflectivity is approximately 1% and the reflected light is sufficiently suppressed.

EXAMPLE 4

As a fourth example (Example 4) according to the invention, the low-reflectance laminated structure with the second semitransparent layer of CuPC 70 nm thick which gives the lowest reflectivity was used as the cathode of the organic EL device 20 according to the second embodiment. The transparent electrode deposited on soda lime glass was patterned. On the transparent electrode, the organic EL device was made by the following process.

On the transparent electrode deposited on the soda lime glass and patterned, a hole injecting layer of copper phthalocyanine 25 nm thick, a hole transporting layer of NPD 45 nm thick and a light emitting layer of $Alq_3$ 60 nm thick were successively deposited by heating in a vacuum chamber. On the light emitting layer, an electron injection additive of $Li_2O$ 0.3 nm thick was deposited. Further, an aluminum layer 5 nm thick and copper phthalocyanine 70 nm and aluminum layer 100 nm thick were successively deposited, whereby an organic EL device according to the fourth example is produced.

COMPARATIVE EXAMPLE 2

As a second comparative example (Comparative example 2), on the transparent electrode deposited on soda lime glass patterned, a hole injecting layer of copper phthalocyanine 25 nm thick, a hole transporting layer of NPD 45 nm thick and a light emitting layer of $Alq_3$ 60 nm thick were successively deposited by heating in vacuum. Thereafter, an electron injection additive of $Li_2O$ 0.3 nm thick was deposited. Finally, an aluminum layer 100 nm thick was deposited, whereby an organic EL device according to the second comparative example is produced.

Figure 6:
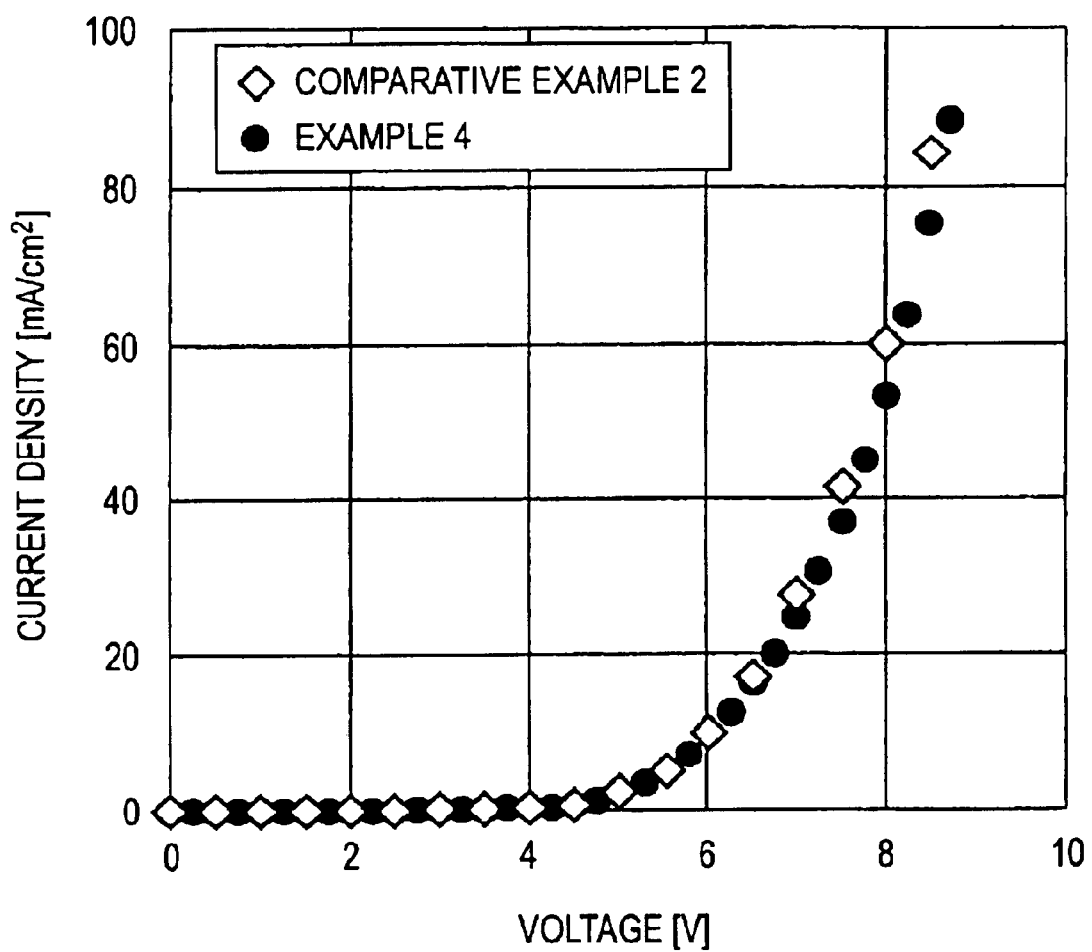
FIG. 6 is a graph for comparing the voltage-current characteristics of the device according to a fourth example and a second comparative example.

FIG. 6 is a graph showing the voltage-current characteristic of the devices according to the fourth example and the second comparative example. From the graph of FIG. 4, it can be seen that the voltage-current characteristic is almost the same in both the second example and the first comparative example. This permits to conclude that the organic diode equally functions in both devices, and the internal light-emitting intensities of the devices for the same current are also equal. Further, it has been also confirmed that the light emitting plane visually recognized is uniform and the low-reflectance laminated structure including CuPC effectively serves as the cathode.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An organic electroluminescence device comprising:
   a low-reflectance laminated structure having low reflectance for a predetermined wavelength band of light with use of optical interference and having a first semitransparent layer, a second semitransparent layer and a reflective layer laminated in this order;
   an organic thin layered unit including a organic material having luminescent characteristic; and
   a pair of electrodes configured to support the organic thin layered unit from both sides,
   wherein the second semitransparent layer comprises the organic material.

2. The organic electroluminescence device as claimed in claim 1, wherein the first semitransparent layer is disposed on the organic thin layered unit.

3. The organic electroluminescence device as claimed in claim 1, wherein the organic thin layered unit comprises at least one of the first semitransparent layer and the second semitransparent layer.

4. The organic electroluminescence device as claimed in claim 1, wherein the second semitransparent layer comprises the organic thin layered unit, and
   wherein the reflective layer comprises the pair of the electrodes.

5. The organic electroluminescence device as claimed in claim 1, wherein the organic thin layered unit comprises the low-reflectance laminated structure.

6. The organic electroluminescence device as claimed in claim 1, wherein the transparent layer comprises electrical conductivity.

7. The organic electroluminescence device as claimed in claim 1, wherein the first semitransparent layer and the reflective layer comprise electrical conductivity, and
   wherein the first semitransparent layer is configured to be connected to the reflective layer at a position where the organic electroluminescence layer is not being laminated.

8. The organic electroluminescence device as claim 1, wherein the organic electroluminescence material is deposited by vacuum evaporation.

9. The organic electroluminescence device as claim 1, wherein the organic electroluminescence material comprises alumiquinolinol complex.

10. The organic electroluminescence device as claim 1, wherein the organic electroluminescence material comprises copper phthalocyanine.

11. The organic electroluminescence device as claim 1, wherein the second semitransparent layer is made of a material same as that of a layer constituting the organic electroluminescence layer.

* * * * *